United States Patent
Kondo et al.

(10) Patent No.: US 9,301,074 B2
(45) Date of Patent: Mar. 29, 2016

(54) DISPLAY UNIT

(75) Inventors: Masao Kondo, Tokyo (JP); Mitsutaka Kimura, Saitama (JP); Junko Teshima, Tokyo (JP); Yoshihide Kurimoto, Tokyo (JP); Takayuki Fujishima, Tokyo (JP); Hiroshi Furukawa, Kanagawa (JP); Akio Suzuki, Tokyo (JP)

(73) Assignee: SONY CORPORATION, Tokyo (JP)

( * ) Notice: Subject to any disclaimer, the term of this patent is extended or adjusted under 35 U.S.C. 154(b) by 382 days.

(21) Appl. No.: 13/115,218

(22) Filed: May 25, 2011

(65) Prior Publication Data
US 2011/0292091 A1    Dec. 1, 2011

(30) Foreign Application Priority Data

Jun. 1, 2010 (JP) ................. 2010-125498

(51) Int. Cl.
*G09G 5/10* (2006.01)
*H04R 29/00* (2006.01)
*G09G 3/32* (2006.01)
*G01R 13/40* (2006.01)

(52) U.S. Cl.
CPC ............ *H04R 29/008* (2013.01); *G01R 13/402* (2013.01); *G09G 3/32* (2013.01); *G09G 3/3225* (2013.01); *G09G 2380/10* (2013.01)

(58) Field of Classification Search
None
See application file for complete search history.

(56) References Cited

U.S. PATENT DOCUMENTS

| | | | |
|---|---|---|---|
| 4,528,501 A * | 7/1985 | Dorrough et al. | 324/103 P |
| 5,247,864 A * | 9/1993 | Konishi | 84/477 R |
| 2003/0011579 A1 * | 1/2003 | Gong et al. | 345/204 |
| 2004/0245438 A1 * | 12/2004 | Payne et al. | 250/221 |
| 2007/0022378 A1 * | 1/2007 | Hamada | 715/716 |
| 2007/0210932 A1 * | 9/2007 | Koshiba | G08C 23/04 340/12.22 |
| 2010/0070773 A1 * | 3/2010 | Tanaka | H04N 21/4622 713/176 |

FOREIGN PATENT DOCUMENTS

| | | |
|---|---|---|
| JP | 53-150214 | 11/1978 |
| JP | 61-144766 | 7/1986 |
| JP | 2003-066886 A | 3/2003 |

* cited by examiner

*Primary Examiner* — Joseph Haley
*Assistant Examiner* — Emily Frank
(74) *Attorney, Agent, or Firm* — Hazuki International, LLC

(57) ABSTRACT

A display unit includes: a display section having a plurality of light-emitting devices arranged in a straight line; a driving section supplying a display driving signal for controlling the luminance of each of the light-emitting devices; and a display control section connected to the driving section for supplying the driving section with either a first display control signal for controlling the luminance of the light-emitting devices to display a preset display pattern according to an operation control signal from a controller or a second display control signal for controlling the luminance of the light-emitting devices in synchronism with the level of an audio signal, wherein the first display control signal is generated based on a wave function.

14 Claims, 18 Drawing Sheets

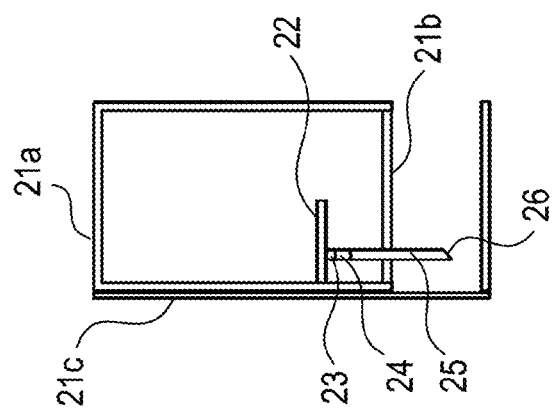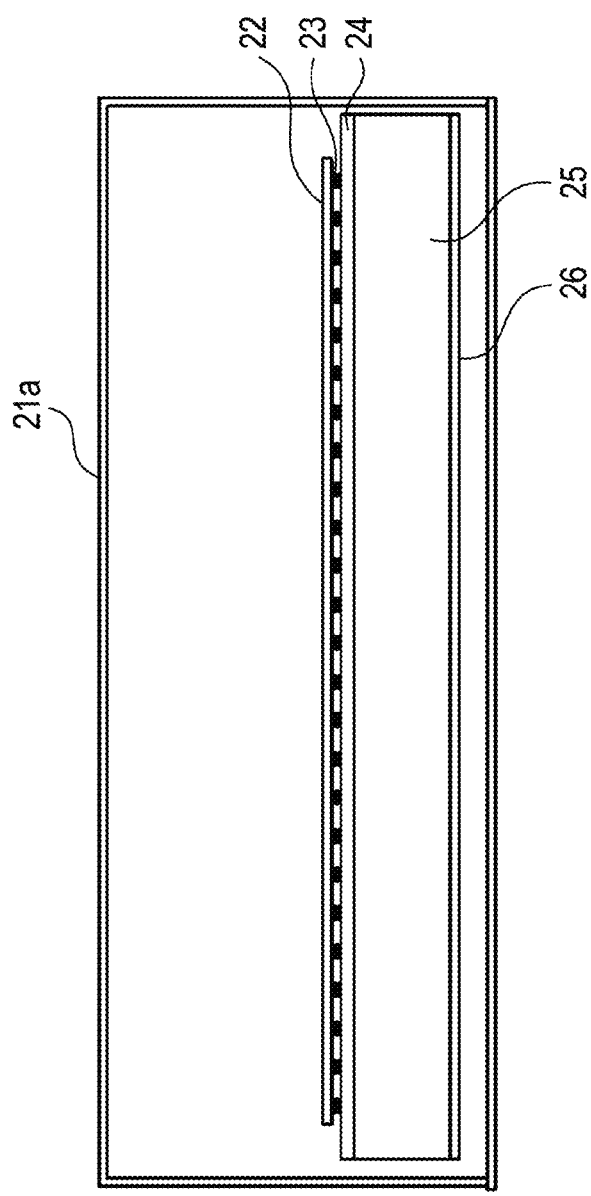

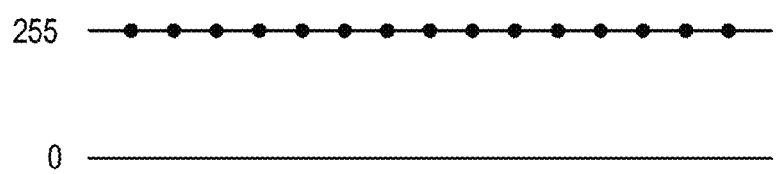
FIG.4A
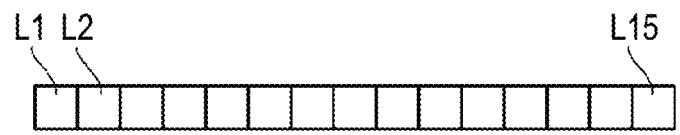
FIG.4B
FIG.4C
FIG.4D
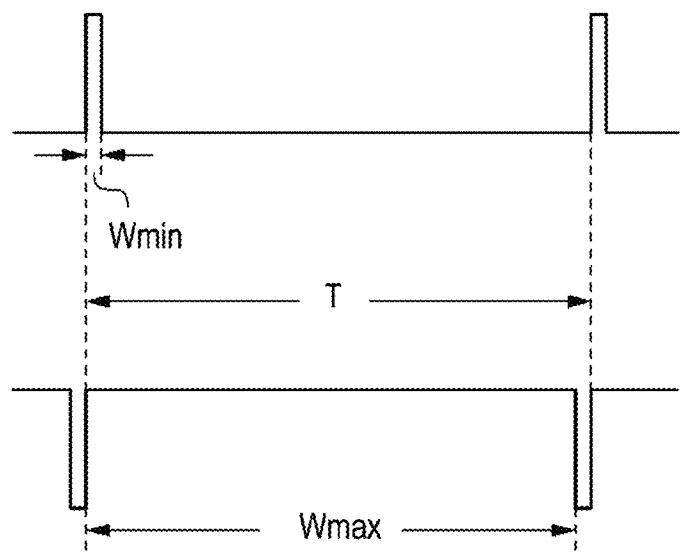
FIG.5A
FIG.5B FIG.10
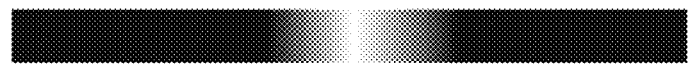
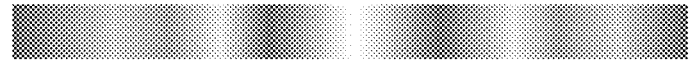

FIG.16
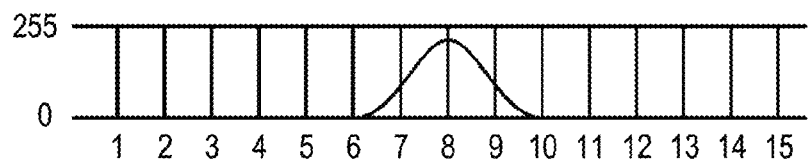
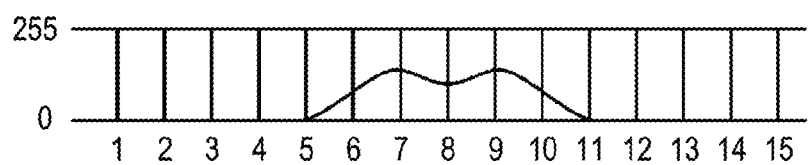
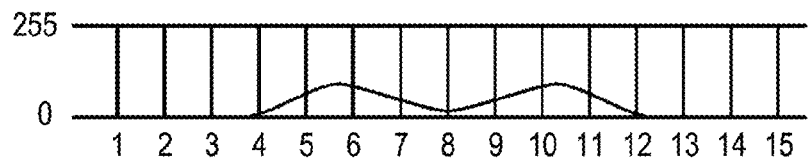
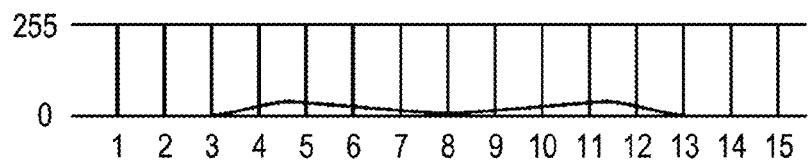
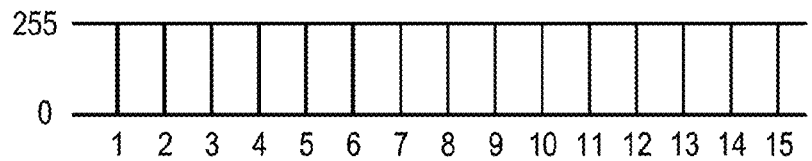

FIG.17A
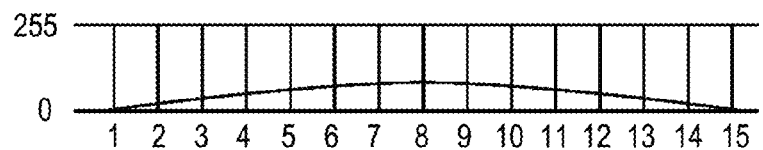
FIG.17B
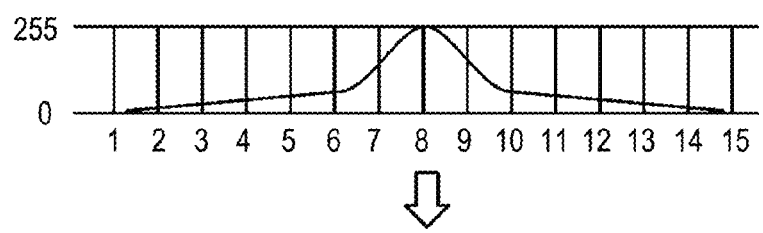
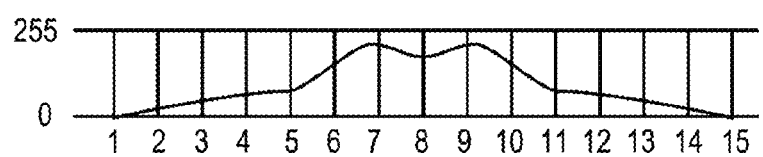
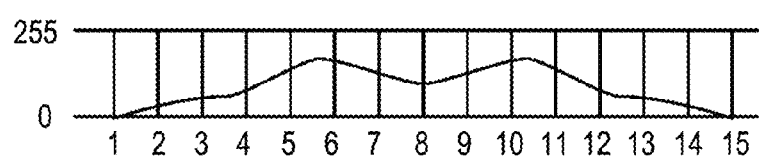
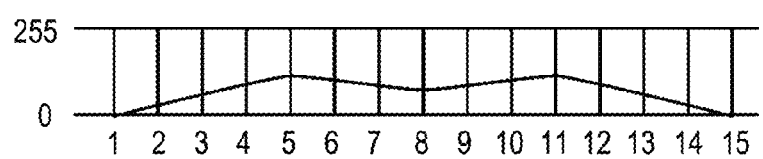
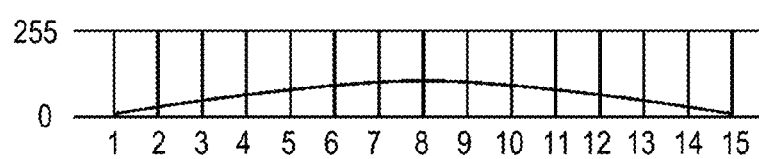

FIG.18A
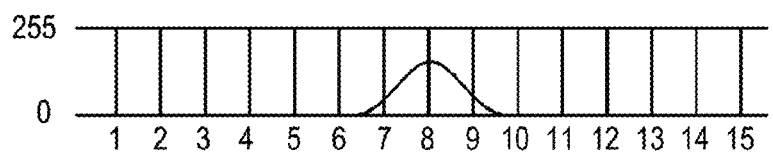
FIG.18B
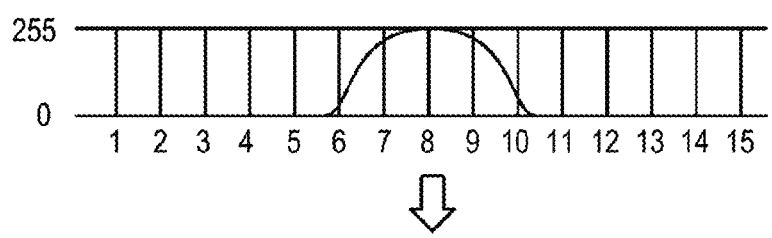
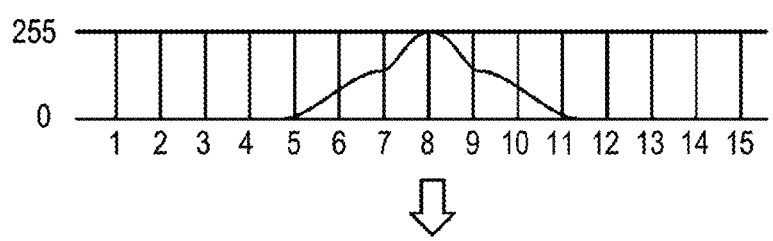
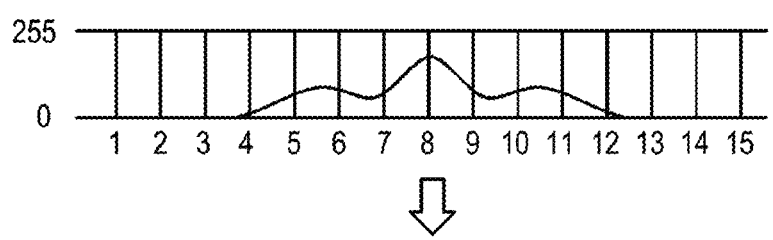
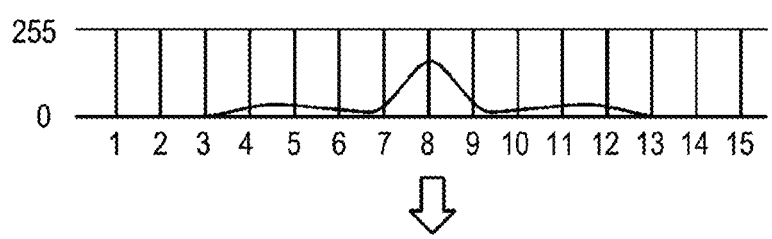
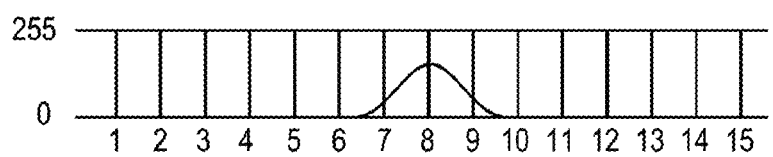

DISPLAY UNIT

FIELD

The preset disclosure relates to a display unit used in, for example, a disc reproduction apparatus.

BACKGROUND

For example, an audio preproduction apparatus displays a variety of impressive patterns in synchronism with audio signals reproduced by the same. As disclosed in JP-A-2003-066886 (Patent Document 1), one known approach toward display of patterns as thus described is to arrange light-emitting diodes (LEDs) in a row and to set the emission level of each LED appropriately.

SUMMARY

According to Patent Document 1, the luminance of the LEDs is sequentially varied according to audio levels such that the plurality of LEDs arranged in a straight line will display a pattern in the form of a group of beams of light without a distinctive gap moving from side to side. Further, Patent Document 1 discloses display control exercised according to transmitting and receiving audio levels of a mobile phone.

According to Patent Document 1, a pattern is displayed in the form of a group of beams of light drifting from side to side, and a problem has arisen in that such a pattern is not necessarily displayed as an impressive view. Further, a pattern displayed on a display unit of a reproduction apparatus may be controlled according to the state of operation of the apparatus. A problem has arisen when displaying a complicated pattern in that it takes time and effort to create display control signals for controlling the display of the pattern.

It is therefore desirable to provide a display unit which allows display control signals for a plurality of light-emitting devices to be relatively simply obtained by generating the display control signals based on a function and which is capable of displaying a pattern according to the state of operation of the apparatus associated therewith.

An embodiment of the present disclosure is directed to a display unit including a display section having a plurality of light-emitting devices arranged in a straight line, a driving section supplying a display driving signal for controlling the luminance of each of the light-emitting devices, and a display control section connected to the driving section for supplying the driving section with either a first display control signal for controlling the luminance of the light-emitting devices to display a preset display pattern according to an operation control signal from a controller or a second display control signal for controlling the luminance of the light-emitting devices in synchronism with the level of an audio signal, wherein the first display control signal is generated based on a wave function.

Preferably, the second display control signal may control a plurality of points connected with each other by a spring and suspended in the vertical direction by causing an uppermost point to be displaced upward by a force according to the amount of energy of the audio signal or a change in the amount of energy, thereby setting the magnitude of a resultant displacement of each of the points as the luminance of the point.

The coefficient of the spring may be changed.

The second display control signal may be selected when there is an audio signal.

The display unit may be configured to include a section for receiving a remote control signal. A third display control signal for controlling the luminance of the light-emitting devices may be generated to display a preset display pattern when the remote control signal is received. The third display control signal may be superimposed on either of the first and second display control signals.

The display unit may be configured such that the first display control signal is provided in the form of an emission level table generating a set of control signals for controlling the luminance of each of the plurality of light-emitting devices on a predetermined cycle.

According to the embodiment of the present disclosure, since the first display control signal is generated based on a wave function, display control signals can be easily generated, and an impressive pattern can be displayed. In addition to a pattern displayed in synchronism with a reproduction signal such as an audio signal, it is possible to display a present pattern according to an operation control signal generated by a controller.

BRIEF DESCRIPTION OF THE DRAWINGS

FIG. 3A is a front view of the reproduction apparatus for explaining an LED display section provided therein, and FIG. 3B is a side view of the apparatus;

FIGS. 4A to 4D are schematic diagrams for explaining control of the luminance of the LED display section;

FIGS. 5A and 5B are schematic diagrams for explaining control of the luminance of LEDs;

FIG. 10 is illustrations showing changes over time of the luminance of the LED display section observed when activating the apparatus;

Figure 11:
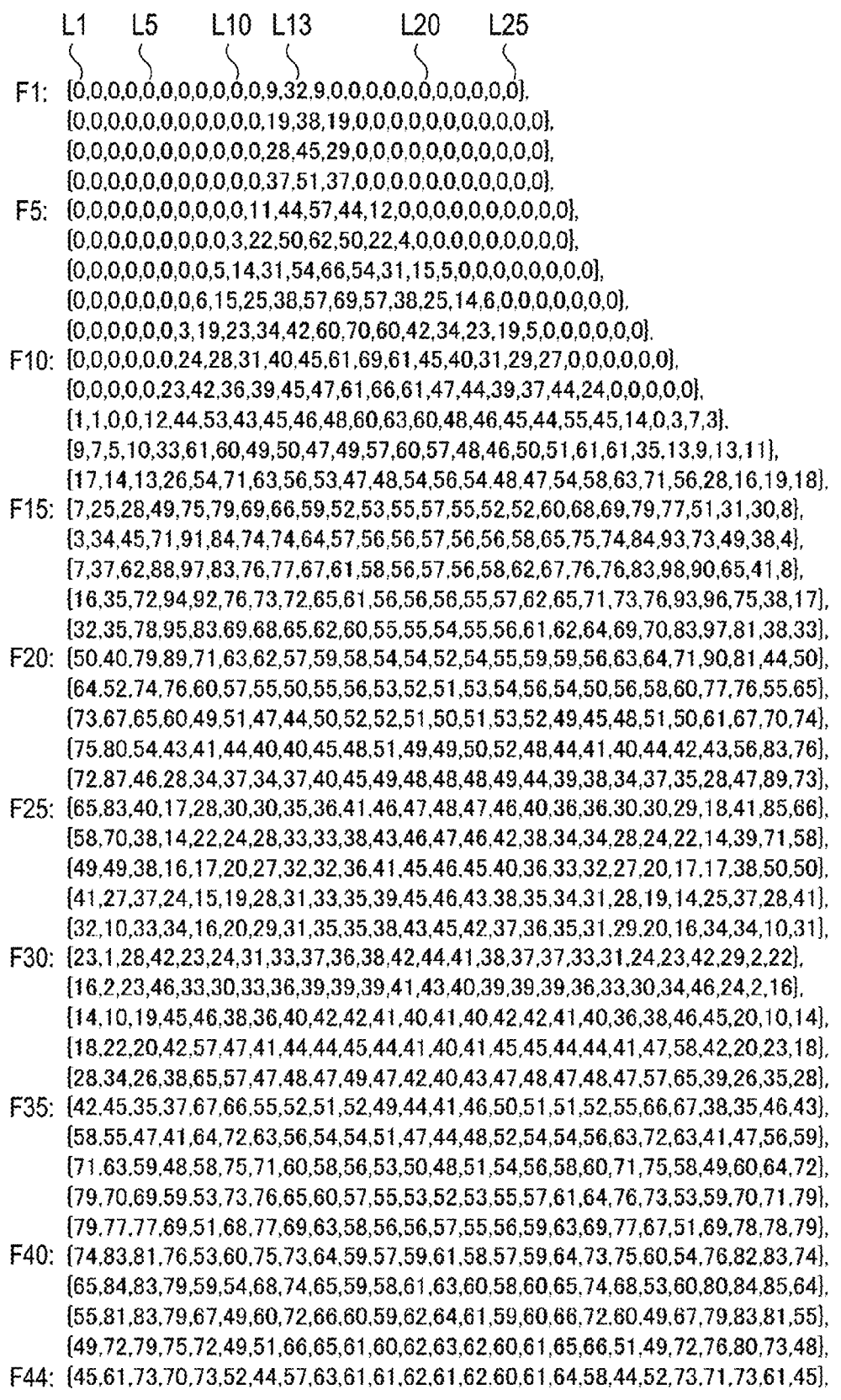

FIG. 11 is a schematic view of an emission level table showing exemplary changes over time of data on the table observed when activating the apparatus;

Figure 12:
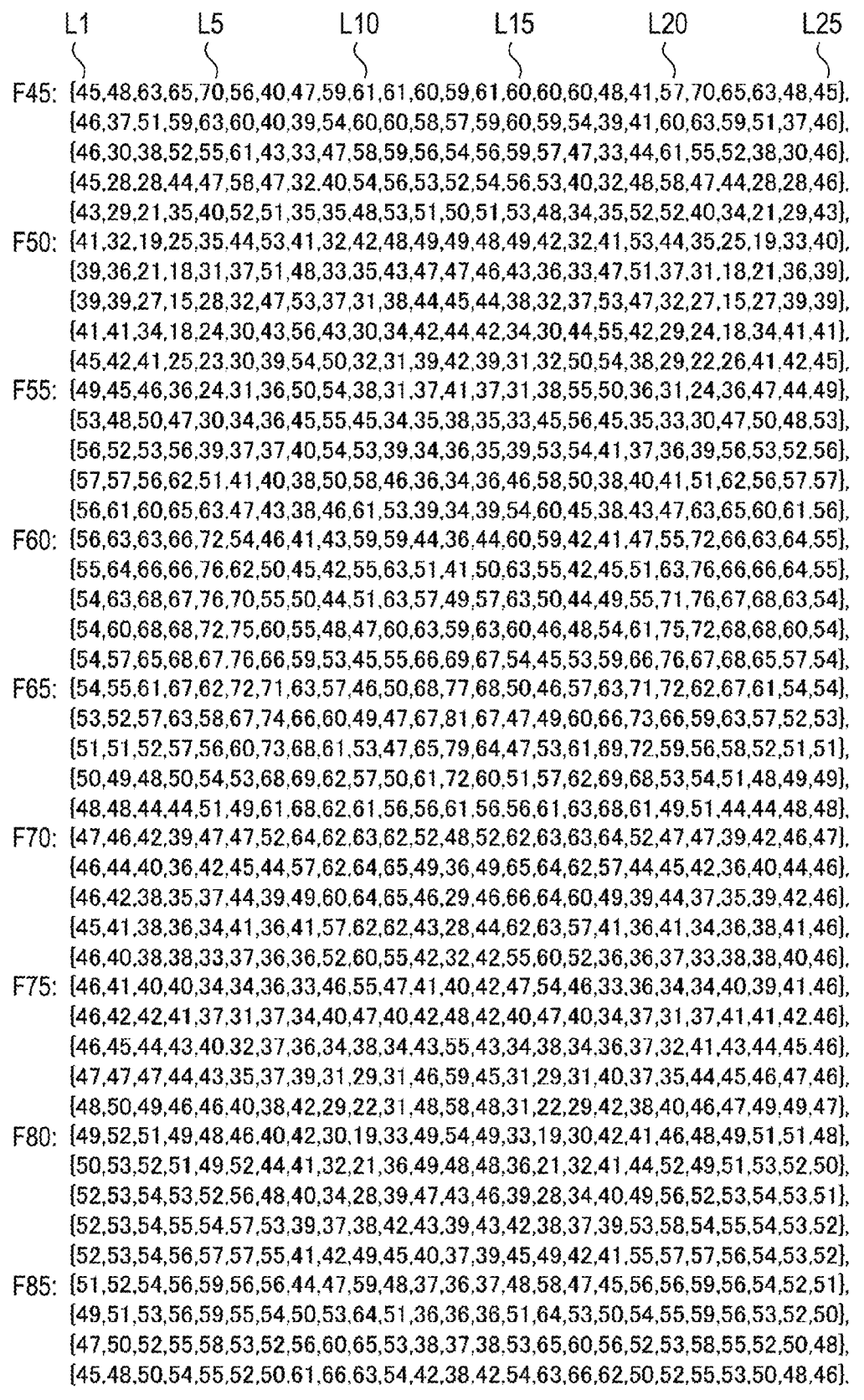

FIG. 12 is another schematic view of the emission level table showing exemplary changes over time of data on the table observed when activating the apparatus;

Figure 13:
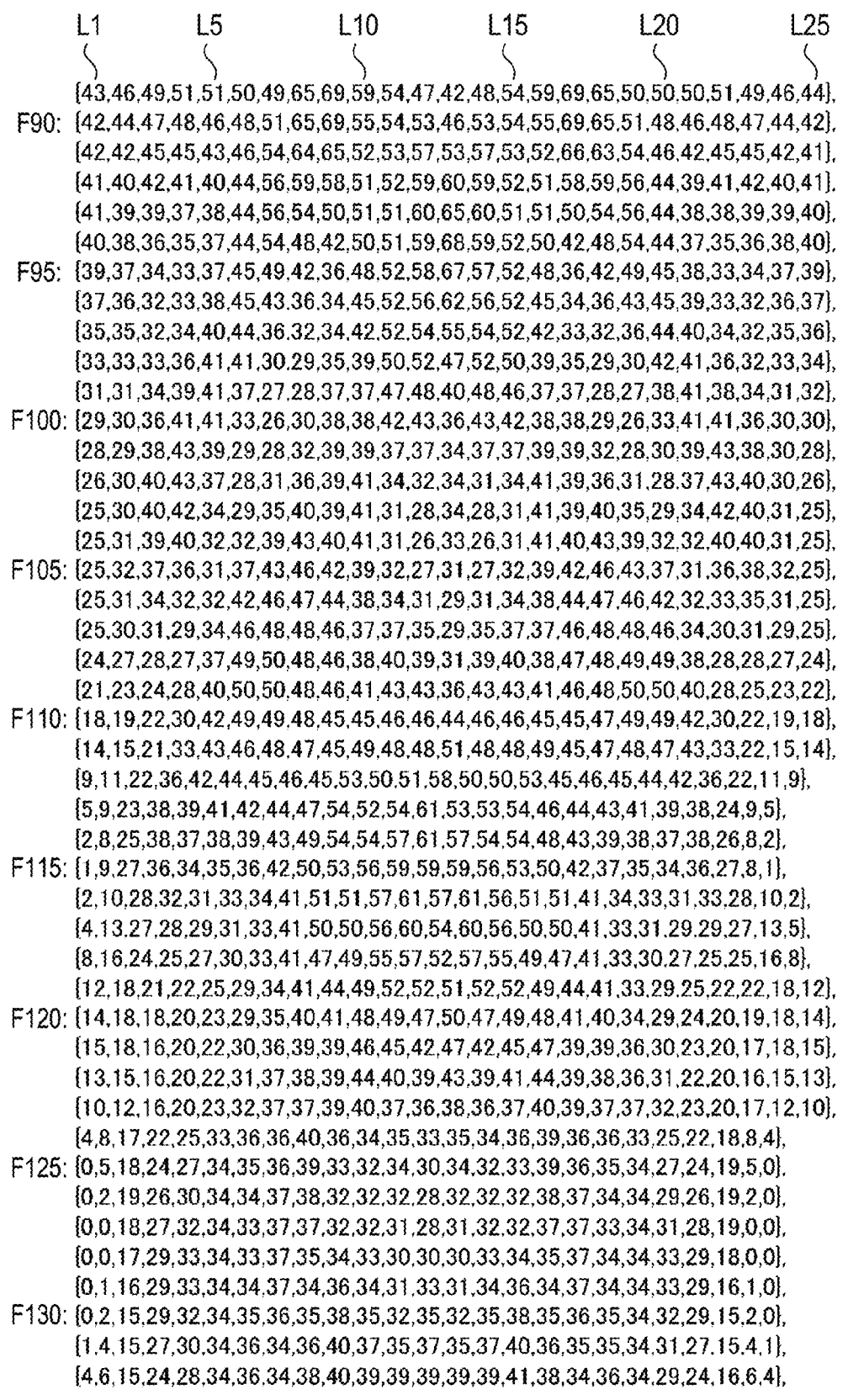

FIG. 13 is still another schematic view of the emission level table showing exemplary changes over time of data on the table observed when activating the apparatus;

Figure 14:
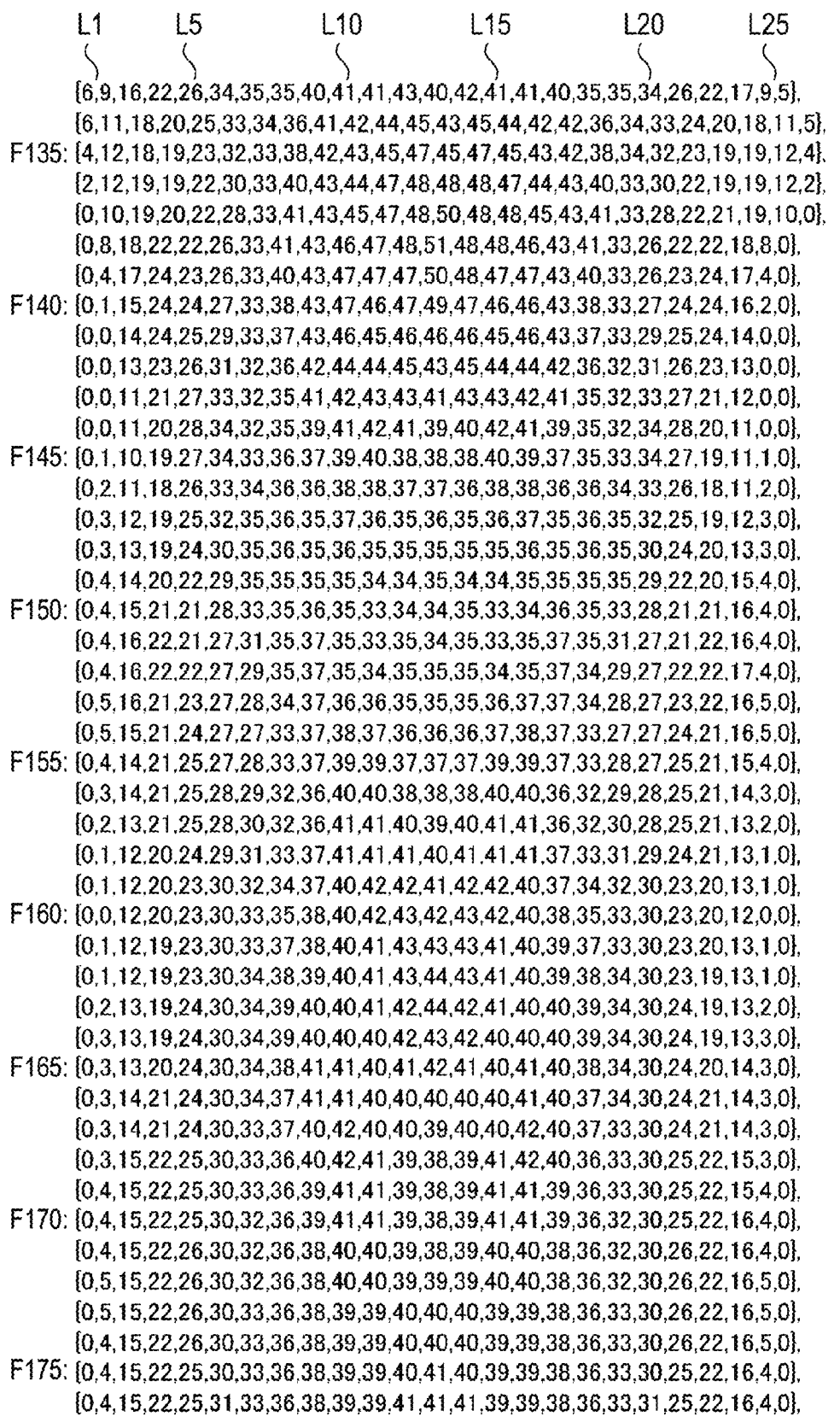

FIG. 14 is still another schematic view of the emission level table showing exemplary changes over time of data on the table observed when activating the apparatus;

Figure 15:
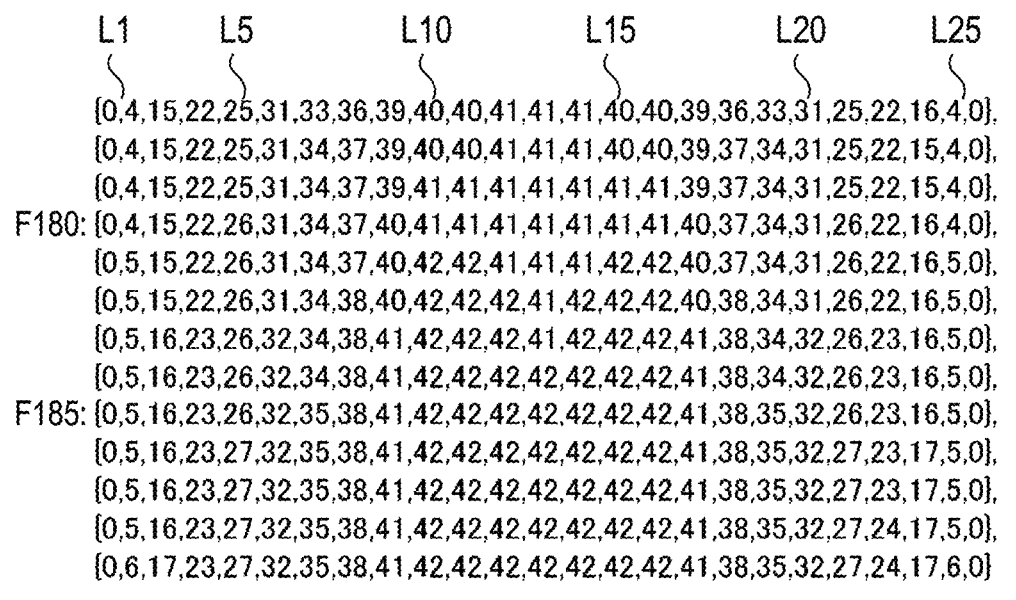

FIG. 15 is still another schematic view of the emission level table showing exemplary changes over time of data on the table observed when activating the apparatus;

FIG. 16 is illustrations showing changes over time of a display control signal for controlling the LED display section in response to an operation on a remote controller;

FIGS. 17A and 17B are illustrations showing changes over time of a display control signal for controlling the LED display section in response to an operation on the remote controller when the apparatus is loaded with no disc;

FIGS. 18A and 18B are illustrations showing changes over time of a display control signal for controlling the LED display section in response to an operation on the remote controller when the apparatus is loaded with a disc.

DETAILED DESCRIPTION

Embodiments of the present disclosure will now be described below. Description will be made in the following order.

<1. Embodiment of the present disclosure>
<2. Modification>

The embodiments described below are preferred example of the present disclosure and include various technically preferred limitations. However, the scope of the present disclosure is not limited to the embodiments by this description unless otherwise specified to limit the present disclosure.

<1. Embodiment of the Present Disclosure>
[Outline of Reproduction Apparatus]

Figure 1A:
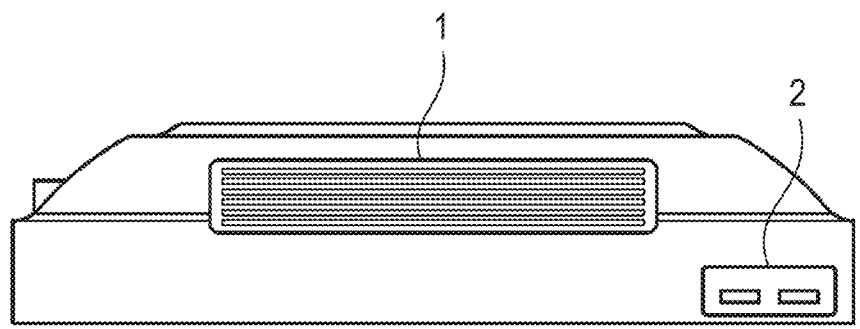
FIG. 1A is a plan view of a reproduction apparatus according to an embodiment of the present disclosure.
Figure 1B:
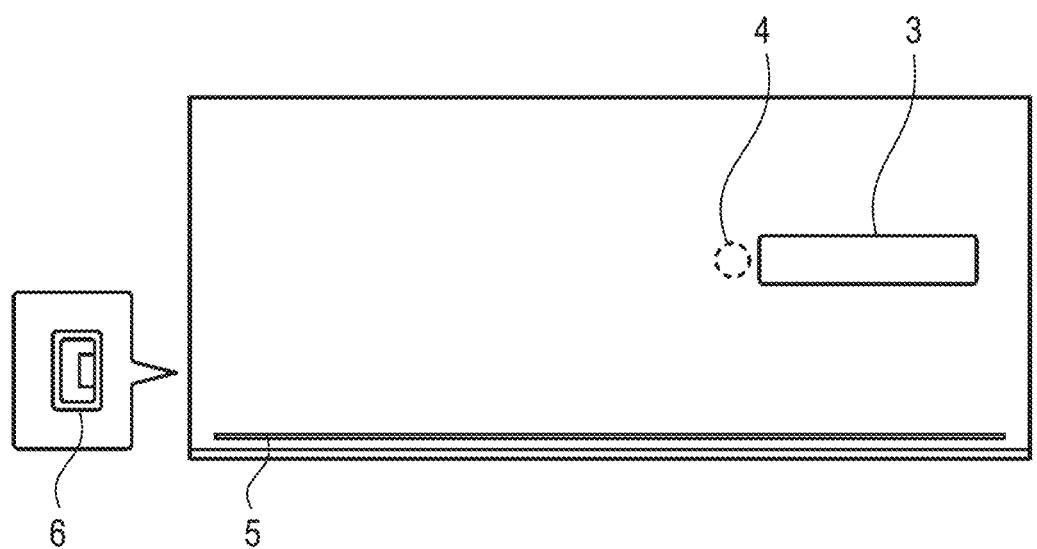
FIG. 1B is a front view of the reproduction apparatus.

FIG. 1A is a plan view of a reproduction apparatus according to an embodiment of the present disclosure, and FIG. 1B is a front view of the reproduction apparatus. The reproduction apparatus has the function of reproducing a disc such as a BD (Blu-ray disc), a DVD (digital versatile disc), or a CD (compact disc), the function of a radio receiver, the function of reproducing audio signals acquired from a USB (universal serial bus) memory, and the function of reproducing audio signals input from outside.

Ventilation slots 1 are formed on part of a top surface and a rear surface of the reproduction apparatus. A volume adjusting switch 2 for increasing and decreasing the sound volume of the apparatus is disposed on the top surface. For example, a front panel display 3 constituted by an LCD (liquid crystal display) is disposed on a front panel of the apparatus. A light-receiving portion 4 for receiving remote control signals (infrared rays) is provided in the vicinity of the front panel display 3. The light-receiving portion 4 receives infrared remote control signals from a remote controller (not shown). An LED display section 5 is disposed at the bottom of the front panel in the form of a straight line extending in the horizontal direction. Further, a USB port 6 is provided on a left lateral surface of the apparatus.

Figure 2:
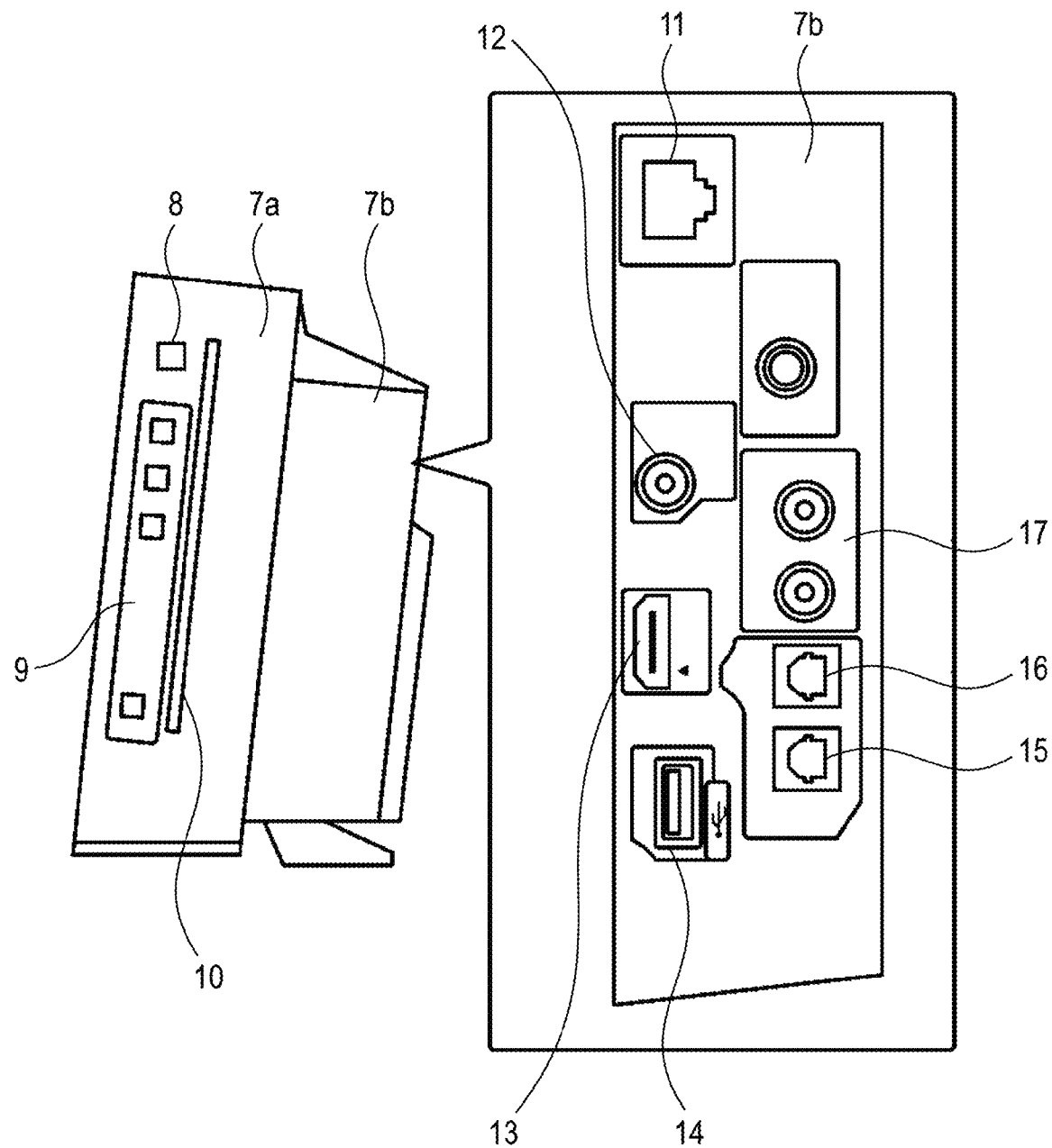
FIG. 2 is a side view of the reproduction apparatus and a partial enlarged view of the same.

FIG. 2 shows a configuration of a right lateral surface of a housing of the reproduction apparatus. The right lateral surface includes by a lateral surface 7a extending to a front surface of the apparatus and a lateral surface 7b diagonally extending to a rear surface of the apparatus. An enlarged view of the lateral surface 7b is show in FIG. 2. A power supply switch 8, operation buttons 9, and a disc insertion slot 10 are provided on the lateral surface 7a. The operation buttons include a reproduction button, a stop button, an eject button, and a reproduction source select button.

Elements provided on the lateral surface 7b include a LAN (local area network) terminal 11, a video output terminal 12, an HDMI (high-definition multimedia interface) terminal 13, a USB port 14, a digital optical input terminal (for television inputs) 15, another digital optical input terminal (for satellite broadcast inputs and cable television inputs) 16, an audio input terminal 17, and an antenna input terminal 18.

[LED Display Section]

The embodiment of the present disclosure is applied to the LED display section 5. The LED display section 5 will now be described in detail with reference to FIGS. 3A and 3B. For example, the display section has a box-like housing formed by a housing 21a and a lid 21b which are made of black plastic. A front side of the box-like housing is covered by a half mirror and a black smoked acrylic plate 21c. The acrylic plate 21c is omitted in the front view (FIG. 3A) of the display section.

A plurality of LEDs (e.g., 25 LEDs) 23 are mounted on an LED substrate 22 extending in the horizontal direction. For example, the LEDs 23 are white LEDs. The LEDs 23 emit light downwardly. The light from the LEDs 23 is projected on a transparent acrylic plate 25 serving as a light guide through opalescent plastic 24. The light of the LEDs 23 is diffused by the opalescent plastic 24 and the transparent acrylic plate 25. An end face 26 of the transparent acrylic plate 25 is obliquely cut, and the end face 26 has a C-shaped section in order to achieve high visibility for a viewer in front of the apparatus. The end face 26 is frosted to form microscopic irregularities on the same. Light exits the end face 26.

For simplicity, let us assume that the LEDs 23 include fifteen LEDs L1 to L15 as shown in FIGS. 4B and 4D. As shown in FIG. 4A, when a driving signal at a maximum level is equally supplied to the LEDs, the LEDs L1 to L15 emit light at maximum luminance. Since the light from the LEDs 23 is diffused by the opalescent plastic 24 and the transparent acrylic plate 25 as described above, the resultant light-emitting region appears in the form of a line having uniform luminance. When a driving signal as shown in FIG. 4C is supplied to the LEDs, the LEDs L1 to L15 emit light as shown in FIG. 4D. Since the light of the LEDs 23 is diffused by the opalescent plastic 24 and the transparent acrylic plate 25, the resultant light-emitting region appears in the form of a line having gradation.

PWM (pulse width modulation) control is used for controlling the luminance of the LEDs. When a display driving signal having a minimum pulse width Wmin is supplied to an LED at a predetermined period T as shown in FIG. 5A, the LED emits light at a minimum level of luminance. When a display driving signal having a maximum pulse width Wmax is supplied to an LED at the predetermined period T as shown in FIG. 5B, the LED emits light at a maximum level of luminance. For example, the pulse width of the display driving signal can be controlled at 128 steps, and the luminance of an LED can therefore be controlled at 128 levels.

[Display Unit]

Figure 6:
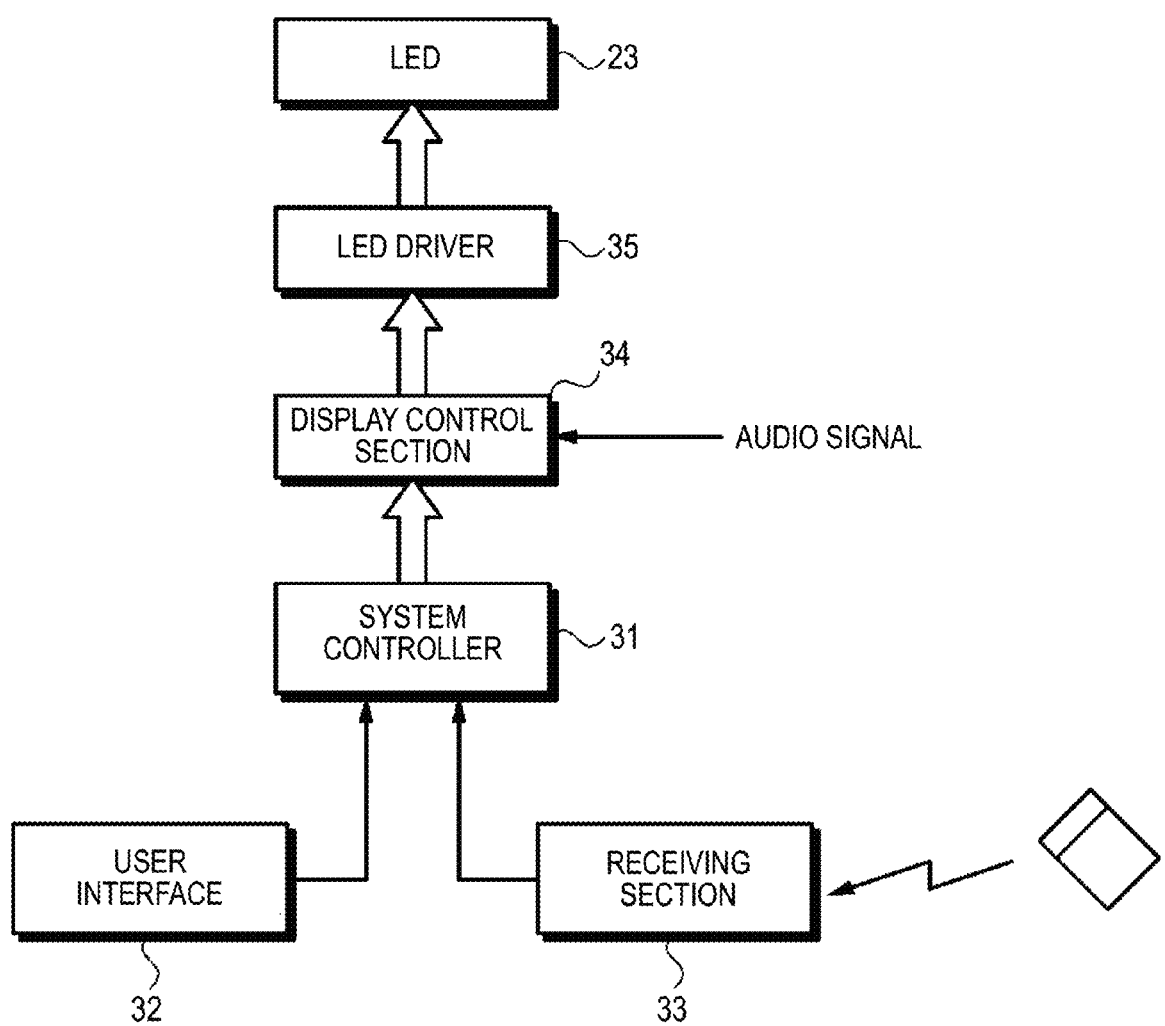
FIG. 6 is a block diagram showing a configuration of the LED display section.

The features shown in FIG. 6 are provided to drive the LED display section 5 of the reproduction apparatus. A disc driving section, a disc reproducing section, and a reproduction signal processing section of the reproduction apparatus will not be described because details of such sections do not particularly relate to the principle of the embodiment of the present disclosure. A system controller 31 is provided for controlling the reproduction apparatus as a whole. The system controller 31 is a microcomputer which is constituted by, for example, a CPU (central processing unit). The system controller 31 includes a ROM (read only memory) and a RAM (random access memory). The system controller 31 executes programs stored in the ROM to exercise systematic control over various parts of the reproduction apparatus.

Operation signals from a user interface 32 are supplied to the system controller 31. The user interface 32 is constituted by the volume adjusting switch 2, the power supply switch 8, and the operation buttons 9. Further, there is provided a receiving section 33 for remote control including the light-receiving portion 4 receiving infrared rays from a remote controller. Remote control commands from the receiving section 33 are supplied to the system controller 31. The system controller 31 receives signals from the user interface 32 and the receiving section 33 and outputs signals for controlling various parts of the reproduction apparatus.

A display control section 34 is connected to a system controller 31. An LED driver 35 is connected to the display control section 34, and the LEDs 23 are connected to the LED driver 35. As described above, the LEDs 23 are, for example, 25 LEDs arranged in a straight line. Audio signals are also supplied to the display control section 34. An audio signal is any of a reproduction signal from a disc, an audio signal received at a receiver, and an audio signal input from outside. Further, audio signals associated with reproduced video signals may be supplied to the display control section 34.

Figure 7:
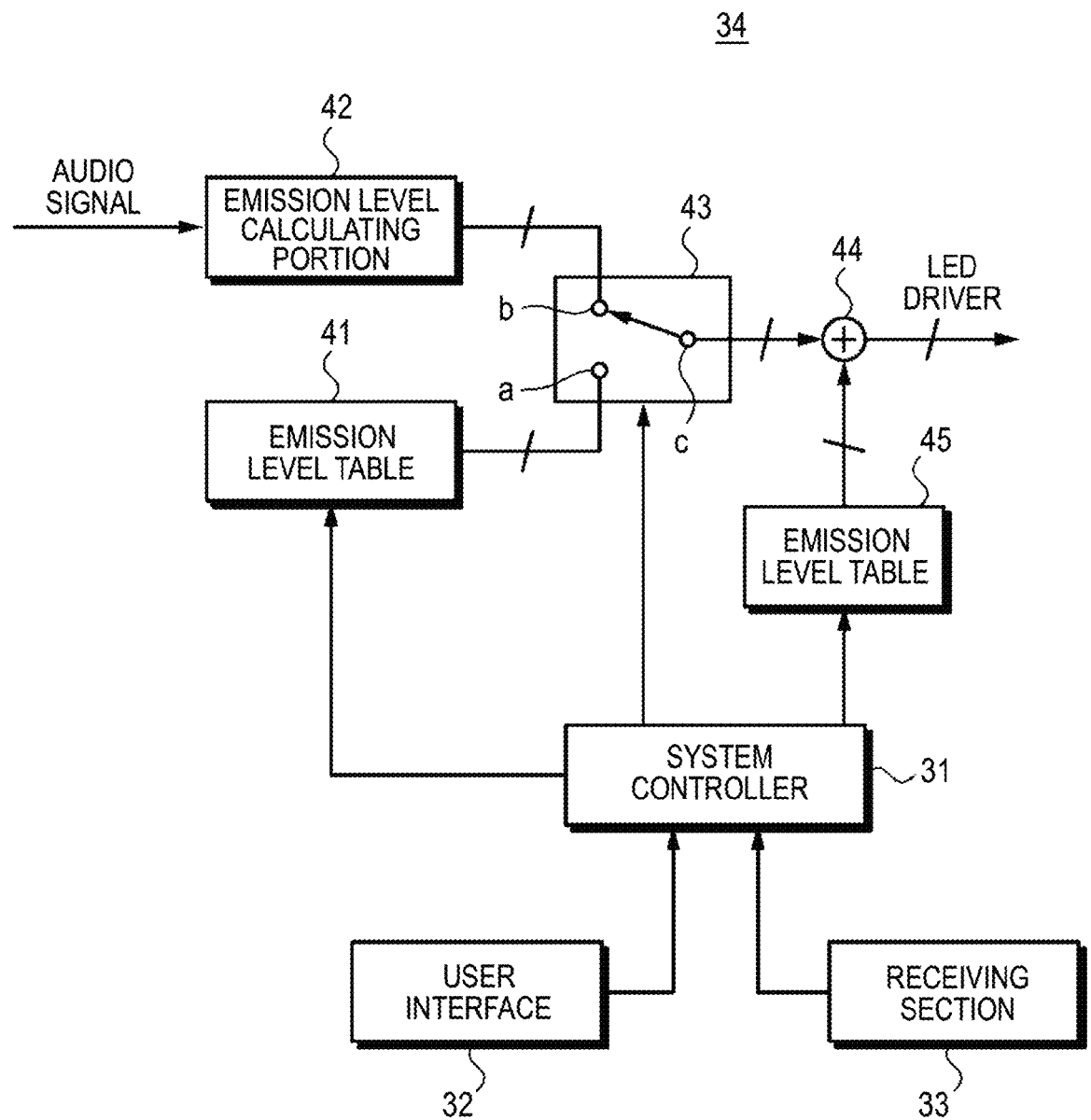
FIG. 7 is a block diagram showing a configuration of a display control section.

Specifically, the display control section 34 is implemented in the form of a microcomputer. The display control section 34 may be represented by blocks associated with functions of the section, as show in FIG. 7. An operation control signal is supplied from the system controller 31 to an emission level table 41 of the display control section 34. According to the operation control signal, the emission level table 41 generates a first display control signal for controlling the luminance of each of the LEDs 23 to render a predetermined display pattern. Specifically, the emission level table 41 is constituted by a ROM, and a set of display control signals or 25 display control signals specifying emission levels of the 25 respective LEDs of the LED group 23 are read out from the emission level table 41.

Further, the display control section 34 includes an emission level calculating portion 42 for generating a second display control signal for controlling the luminance of each of the LEDs 23 in synchronism with the level of an audio signal. The second display control signal output by the emission level calculating portion 42 is similar to the first display control signal in that it is a set of display control signals, i.e., 25 display control signals specifying emission levels of the 25 respective LEDs. The first display control signal output from the emission level table 41 is supplied to one input terminal a of a switch circuit 43, and the second display control signal output from the emission level calculating portion 42 is supplied to another input terminal b of the switch circuit 43.

The switch circuit 43 is controlled by control signals from the system controller 31, and the circuit outputs either of the first display control signal and the second display control signal from an output terminal c. The switch circuit 43 selectively outputs the first display control signal supplied from the input terminal a when there is no audio signal and selectively outputs the second display control signal supplied from the input terminal b when there is an audio signal. The signal output from the switch circuit 43 is supplied to an addition circuit 44. A third display control signal from an emission level table 45 is supplied to the addition circuit 44. The third display control signal is similar to the first and second display control signals in that it is a set of display control signals, i.e., 25 display control signals specifying emission levels of the 25 respective LEDs. Display control signals output from the addition circuit 44 are supplied to the LED driver 35, and each of the LEDs 23 is driven by a display control signal output from the addition circuit 44.

[Emission Level Table]

Operation control signals from the system controller 31 are supplied to the emission level table 41, and display control signals specifying emission levels of the LEDs are output from the table according to the operation control signals. A display control signal is updated at a predetermined frame rate, e.g., 32 frames per sec. (a period of 31.25 ms). For example, when the power supply switch 8 is turned on to activate the display unit, a pattern like wavy water is displayed on the LED display section 5 in response to the activating operation.

Figure 8:
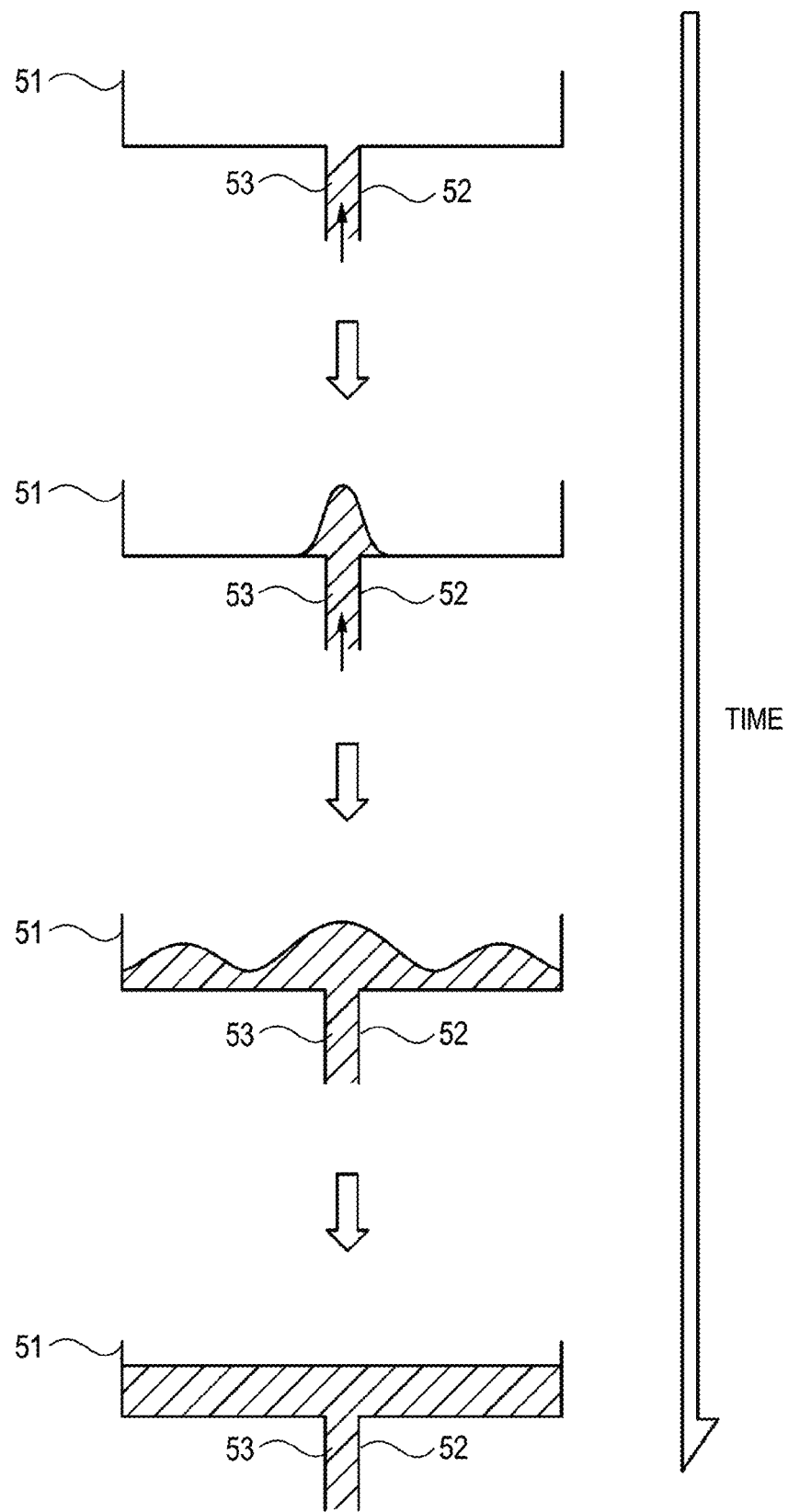
FIG. 8 is schematic illustrations representing a conceptual model for explaining a display control method used when activating the apparatus.

FIG. 8 shows a conceptual model for explaining patterns displayed on the LED display section 5 at the time of activation. In FIG. 8, the flow of time is represented by the downward arrow. An empty state of a container 51 is associated with the off-state of the power supply. When the power supply is turned on, water 53 instantaneously spurts out from a tube 52 located substantially in the middle of the bottom of the container. First, the water 53 spurts upward from the tube 52. At the following stage when the water 53 is gradually accumulated in the container 51, the surface of the water is wavy. When the supply of the water 53 is stopped, the water gradually settles from the wavy state, and the surface of the water finally becomes flat.

Figure 9:
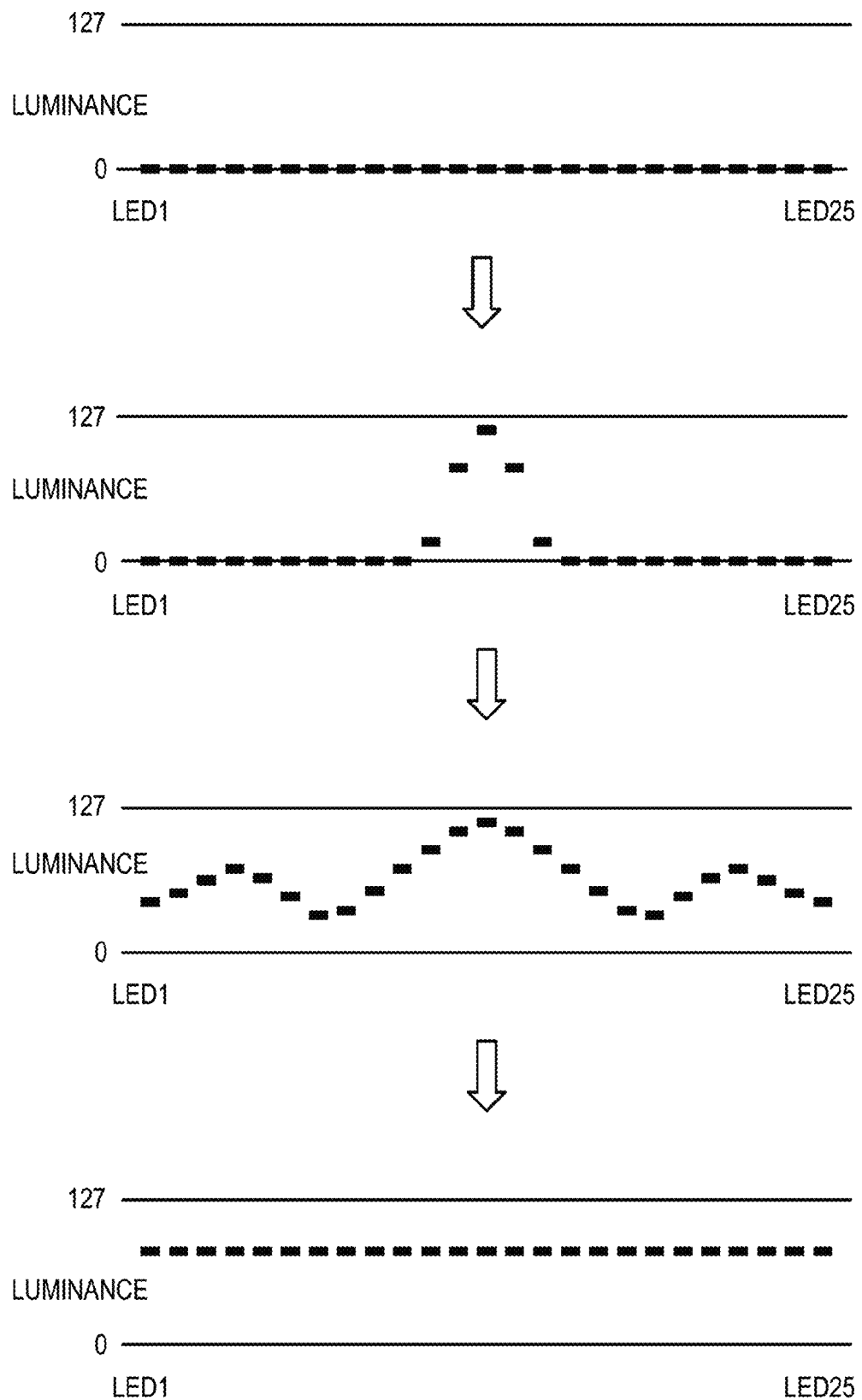
FIG. 9 is schematic illustrations showing changes over time of the luminance of LEDs observed when activating the apparatus.

The duration of the series of movements shown in FIG. 8 is set substantially equal to the time required for activating the reproduction apparatus. As shown in FIG. 9, the series of changes in the level of water is associated with changes in the luminance of the 25 LEDs. As a result of such the process, the patterns shown on the LED display section 5 are rendered with a level of luminance which gradually spreads from a central position of the patterns in the horizontal direction. FIGS. 9 and 10 show pattern transitions similar to those shown in FIG. 8 occurring with time as indicated by the downward arrows. A pattern like a wavy water surface can be displayed by changing the heights of wave peaks of the water surface.

FIG. 8 shows a conceptual model, and the value of each frame on the emission level table 41 is determined by reading a numerical value obtained by simulating a wave function. Specifically, temporal changes in the vertical displacements of waves are calculated using a wave equation. FIGS. 11 to 15 show a specific example of an emission level table obtained based on a wave function. In this example, an emission level table is formed by sets of data specifying emission levels, i.e., first to 189-th frames where the first and 189-th frame are represented by F1 and F189, respectively. Each set of data includes items of data specifying emission levels of the LEDs L1 to L25, respectively. For example, let us assume that the LEDs L1, L13, and L25 are located at the left end, the center, and the right end of the LED display section 5 respectively when the section is viewed from a position in front of the apparatus. The data specifying emission levels are converted into display driving signals having pulse widths of a PWM waveform by the LED driver 35, and the signals are supplied to the LEDs L1 to L25 of the LED display section 5, respectively.

When a user operates a remote controller and the receiving section 33 receives infrared signals from the commander, patterns as shown in FIG. 16 are displayed according to a third display control signal generated by the emission level table 45. FIG. 16 shows display control signals used when the LED display section 5 has 15 LEDs (L1 to L15). Immediately after a remote control signal is received (see the graph at the top of FIG. 16), a display control signal causing only LEDs in the middle of the section (LEDs L7, L8, and L9) to emit with high luminance is generated. Thereafter, a display control signal is generated to display patterns in which the region in high luminance spreads in the horizontal direction as time passes and in which the luminance is gradually reduced. When a predetermined number of frames have been displayed as thus described, a display control signal to stop the emission as shown in the graph at the bottom of FIG. 16 is generated. The user of the commander can confirm that the operation has been accepted by the apparatus from the display of such patterns on the LED display section 5.

In the present embodiment of the present disclosure, the LED display section 5 displays different patterns when the reproduction apparatus has a disc loaded therein and when the reproduction apparatus has no disc loaded therein. A user can recognize whether there is a disc or not from different patterns as thus described. When the remote controller is operated, display control signals from the emission level table 45 are added to display control signals from the emission level table 41 by the addition circuit 44 regardless of whether there is a disc or not.

FIG. 17A shows a display control signal supplied to the LED display section 5 when there is no disc. In this case, the LED display section 5 displays a faintly bright strip. When the remote controller is operated when there is no disc, the display control signals for displaying the pattern described above with reference to FIG. 16 are superimposed on the display control signal shown in FIG. 17A. Thus, display control signals causing pattern transitions as shown in FIG. 17B are generated. Therefore, pattern transitions take place according to the operation on the remote controller also when there is no disc, and the user can recognize that the operation on the remote controller has been accepted by the apparatus.

FIG. 18A shows a display control signal supplied to the LED display section 5 when there is a disc. In this case, the LED display section 5 has high luminance only in the vicinity of the center thereof. When the remote controller is operated when there is a disc, the display control signals for displaying the pattern described above with reference to FIG. 16 are superimposed on the display control signal shown in FIG. 18A to generate display control signals as shown in FIG. 18B. Therefore, pattern transitions take place according to the operation on the remote controller also when there is a disc, and the user can recognize that the operation on the remote controller has been accepted by the apparatus.

[Emission Level Calculating Portion]

The emission level calculating portion 42 included in the display control section 34 generates display control signals specifying emission levels having magnitudes in accordance with amounts of energy (dB) of audio signals. According to the display control signals, the range and luminance of a pattern displayed on the LED display section 5 change in accordance with musical tones. A method of controlling levels in synchronism with audio signals is described in the form of a conceptual model as shown in FIG. 19.

The LED display section 5 is formed by 25 LEDs, and the LED in the middle of the section (LED L13) corresponds to a point P13. The LEDs L1 (on the left end) to L12 correspond to points P1 to P12. Control exercised over the emission levels of the LEDs L14 to L25 on the right side of the section is omitted in the figure because it is similar to control exercised over the emission levels of the LEDs on the left side. It is assumed that each of the points P1 to P13 has no mass. The points P1 to P13 are connected to each other by springs.

The points P1 to P13, which are connected to each other in the vertical direction by springs, are supported as a whole by a moving point Pa through a spring 61. The point Pa is displaced upward according to acceleration of the amount of acoustic energy of (dB). The use of acceleration allows changes in the amount of energy (volume) to be emphasized. Further, the point Pa, the points P1 to P13 and the springs connecting those points are connected as a whole to a moving point Pb through a spring 62. The point Pb is displaced upward. The point Pb changes according to an average magnitude of levels of musical tones.

Figure 19:
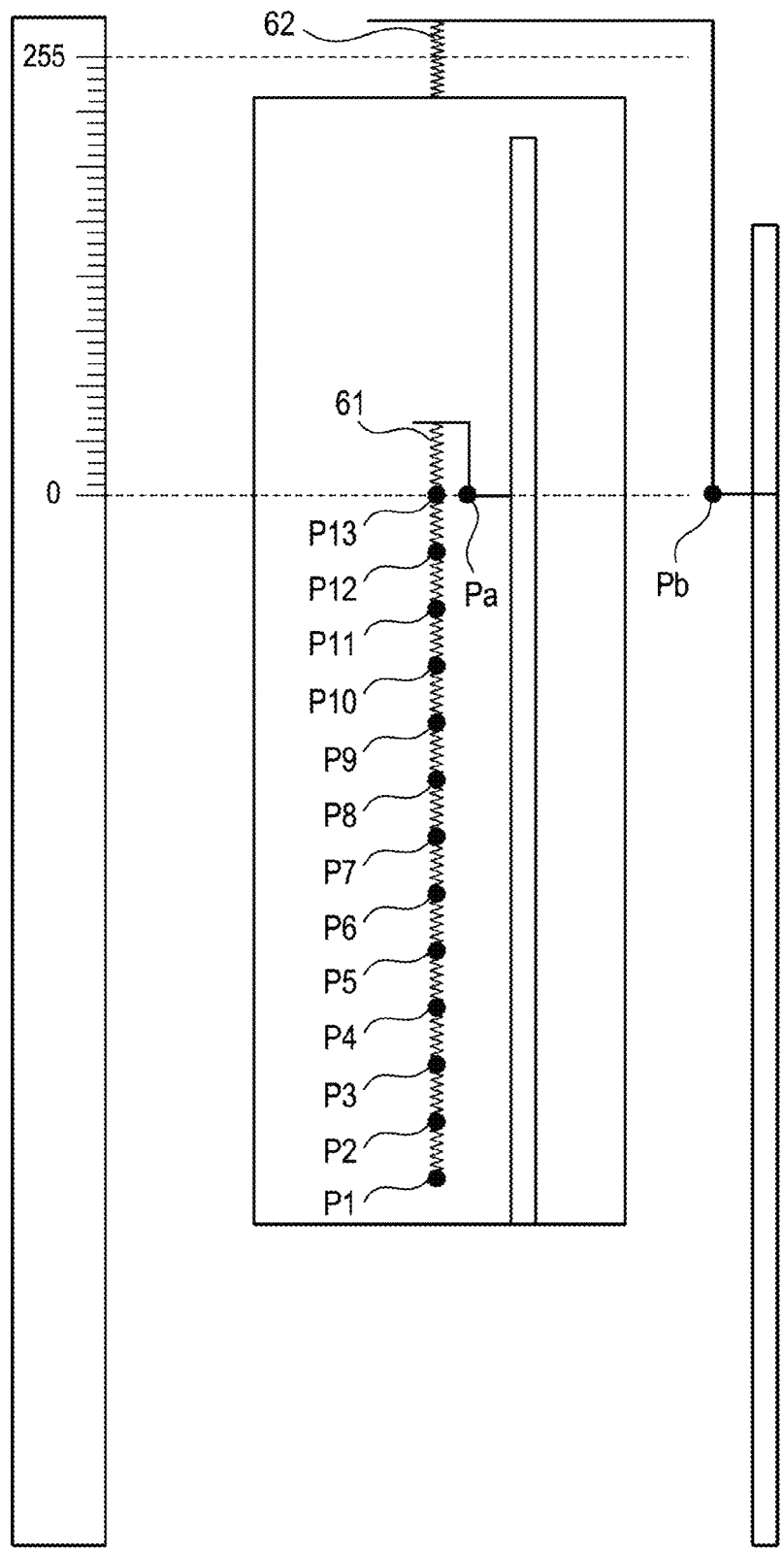
FIG. 19 is a schematic illustration showing a conceptual model of a method of controlling emission levels of LEDs in synchronism with an audio signal.

In the model shown in FIG. 19, when the point Pa is displaced upward according to acceleration, the point P13 follows the movement. The vertical coordinate of the point P13 is obtained by multiplying the acceleration by a certain coefficient. The points P1 to P12 are also displaced upward pursuant to the point P13. The position of each point in the vertical direction is set as the emission level of the LED associated with the point. The positions of the points P1 to P13 in the vertical direction pursuant to the displacement of the point Pa attributable to acceleration can be identified by solving equations of motion of the springs.

A relational expression of a spring will now be described. Let us assume that one of adjoining points, i.e., a point PB moves and that the other point connected to through a spring, i.e., a point PA tends to return to the position PB. Then, the following equation holds true.

$$xp = xp \times \text{inertia} + (B-A) \times k$$

$$A{+}=xp$$

where xp represents a force (variable); k represents a spring coefficient; "inertia" represents an inertial force; B represents the coordinate of the point PB; and A represents the coordinate of the point PA.

A simulation carried out using the equation allows the emission level of each LED to be obtained. Software processes associated with such a calculation are carried out at the emission level calculating portion 42. The value of spring coefficient k can be changed. Higher music tone follow-up performance can be achieved by setting a greater spring coefficient. For example, the quickness of follow-up is set according to a setting operation performed by a user.

A pattern represented by light spreading from a central position to the left and right can be displayed by controlling the emission level of each LED according to the volume of sounds using the conceptual model employing springs as shown in FIG. 19. Further, when representing sounds having a great average volume, control can be exercised to display a pattern having high luminance as a whole. Thus, when the remote controller is operated in a case wherein a pattern is changed in synchronism with a piece of music, patterns indicating that the operation on the remote controller has been accepted are displayed in the same manner as for the emission level table.

<2. Modification>

The embodiment of the present disclosure may be applied to display units of electronic apparatus other than disc reproduction apparatus. Light-emitting devices other than white LEDs may alternatively be used.

The present disclosure contains subject matter related to that disclosed in Japanese Priority Patent Application JP 2010-125498 filed in the Japan Patent Office on Jun. 1, 2010, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display unit comprising:
  a display section having a plurality of light-emitting devices arranged in a straight line;
  a driving section supplying a display driving signal for controlling the luminance of each of the light-emitting devices;

a receiving section configured to receive a remote control signal from a remote controller; and a display control section connected to the driving section and configured to supply the driving section with a selected display control signal of a first display control signal for controlling the luminance of the light-emitting devices to display a preset display pattern according to an operation control signal from a controller and a second display control signal for controlling the luminance of the light-emitting devices in synchronism with the level of an audio signal, wherein one of the first display control signal and the second display control signal is superimposed on a third display control signal based on the received remote control signal, and wherein, the first display control signal is generated based on a wave function describing motion of a liquid.

2. A display unit according to claim 1, wherein the second display control signal controls the luminance based on a model in which a plurality of points are connected with each other by a spring and suspended in a vertical direction, the plurality of points being controlled by causing an uppermost point to be displaced upward by a force according to an amount of energy of the audio signal or a change in the amount of energy, thereby setting a magnitude of a resultant displacement of each of the plurality of points as the luminance of the point.

3. A display unit according to claim 2, wherein a spring coefficient of the spring can be changed.

4. A display unit according to claim 1, wherein the second display control signal is selected in an event the audio signal is present.

5. A display unit according to claim 1,
wherein, the third display control signal for controlling the luminance of the light-emitting devices is generated to display another preset display pattern when the remote control signal is received
from the remote controller.

6. A display unit according to claim 1, wherein an emission level table provides a set of control signals for controlling the luminance of each of the plurality of light-emitting devices on a predetermined cycle.

7. The display unit according to claim 1, wherein the first display control signal is selected in response to an apparatus comprising the display unit being turned on.

8. A display unit according to claim 1, wherein the first display control signal is generated such that the luminance of the light emitting devices varies according to a numerical value read from an emission level table, the numerical value being obtained by simulating the wave function describing the motion of the liquid.

9. An audio reproduction apparatus, comprising:
a display having a plurality of light-emitting devices arranged in a line;
a driver configured to supply a display driving signal for controlling the luminance of each of the light-emitting devices;
a receiver configured to receive a remote control signal from a remote controller;
a display controller connected to the driver and configured to supply the driver with a display control signal to control the luminance of the light-emitting devices to display a preset display pattern, wherein the display control signal is generated based on a wave function describing motion of a liquid, and
wherein the display control signal is superimposed on another display control signal based on the received remote control signal.

10. The audio reproduction apparatus according to claim 9, wherein
the driver is supplied with the display control signal to control the luminance of the light-emitting devices to display the preset display pattern in response to the audio reproduction apparatus being turned on.

11. The audio reproduction apparatus according to claim 9, wherein the display controller is further configured to control the luminance of the light-emitting devices in synchronism with an audio signal.

12. The audio reproduction apparatus according to claim 9, wherein the other display control signal is generated to control the luminance of the light-emitting devices to display another preset display pattern.

13. A reproduction method, comprising:
receiving a remote control signal from a remote controller; and
supplying a display driving signal for controlling a luminance of a plurality of light-emitting devices based on a display control signal, the display control signal controlling the plurality of light emitting devices to display a preset display pattern, wherein the display control signal is generated based on a wave function describing motion of a liquid, wherein the luminance of the light-emitting devices is controlled in synchronism with an audio signal, and wherein the display control signal is superimposed on another display control signal based on the received remote control signal.

14. The reproduction method according to claim 13, wherein the other display control signal is generated to control the luminance of the light-emitting devices to display another preset display pattern.

* * * * *